United States Patent [19]

Shimamoto et al.

[11] Patent Number: 5,309,021
[45] Date of Patent: May 3, 1994

[54] SEMICONDUCTOR DEVICE HAVING PARTICULAR POWER DISTRIBUTION INTERCONNECTION ARRANGEMENT

[75] Inventors: Haruo Shimamoto; Jun Shibata; Toru Tachikawa; Tetsuya Ueda; Hiroshi Seki, all of Itami, Japan

[73] Assignee: Mitsubishi Denki Kabushiki Kaisha, Tokyo, Japan

[21] Appl. No.: 961,352

[22] Filed: Oct. 15, 1992

[30] Foreign Application Priority Data

Oct. 16, 1991 [JP] Japan .................. 3-267649

[51] Int. Cl.⁵ .................. H01L 39/02; H01L 23/58; H01L 23/12; H01L 23/48
[52] U.S. Cl. .................. 257/691; 257/666; 257/698
[58] Field of Search .......... 257/704, 668, 673, 666, 257/672, 691, 698, 692

[56] References Cited

U.S. PATENT DOCUMENTS

| | | | |
|---|---|---|---|
| 4,612,504 | 9/1986 | Moyer | 257/666 |
| 4,812,949 | 3/1989 | Fontan et al. | 257/668 |
| 4,949,158 | 8/1990 | Ueda | 257/668 |
| 5,016,084 | 5/1991 | Nakao | 257/704 |
| 5,057,805 | 10/1991 | Kadowaki | 257/666 |

FOREIGN PATENT DOCUMENTS 62-111457  5/1987  Japan .
62-162848  10/1987  Japan .
3178139   8/1991   Japan .

*Primary Examiner*—Sheila V. Clark
*Attorney, Agent, or Firm*—Leydig, Voit & Mayer

[57] ABSTRACT

A semiconductor device according to the present invention has reduced inductance on a power supply line, a grounding line, and signal lines. In this invention, to reduce the length of the power supply connection and that of the grounding connection, a power supply metal post and a grounding metal post are respectively provided on a power supply lead of a semiconductor chip and grounding lead of the semiconductor chip perpendicular to the leads. The metal posts protrude from the resin encapsulating the chip and are connected to lands or a conductive circuit pattern on a printed circuit board. Furthermore, a planar conductor commonly connecting the power supply or grounding potentials is provided.

13 Claims, 4 Drawing Sheets

SEMICONDUCTOR DEVICE HAVING PARTICULAR POWER DISTRIBUTION INTERCONNECTION ARRANGEMENT

BACKGROUND OF THE INVENTION

1. Field of the Invention

The present invention relates to a semiconductor device which is a packaged semiconductor chip.

2. Description of the Related Art

FIG. 7 is a perspective view, partially broken away to show the internal structure, of a conventional quad-flat-packaged (QFP) semiconductor device. FIG. 8 is a cross-sectional view illustrating mounting of the semiconductor device of FIG. 7 on a printed-circuit board. The QFP semiconductor device is of the type in which the leads are located on the four side surfaces of the package.

A semiconductor device 1 includes a semiconductor chip 2 packaged in a molding resin 6 which forms the package. The semiconductor chip 2 is die bonded to a die pad 3 with a soldering material 3a. The semiconductor chip 2 has a plurality of electrode pads 2a on the peripheral edge of an upper surface thereof. A plurality of leads 4, each including an inner lead 4a located within the molding resin 6 and an outer lead 4b exposed from the molding resin 6, are provided around the semiconductor chip 2. An inner end portion 4c of each of the inner leads 4a is electrically connected to a corresponding electrode pad 2a on the semiconductor chip 2 by a thin metal wire 5 made of, for example, gold (Au) or the like.

To join the thin metal wire 5 to the inner end portions 4c of each of the inner leads 4a, each inner end portions 4c is plated, such as with silver (Ag). The outer lead 4b of each of the leads 4 which is exposed from the molding resin 6 is curved in a desired form.

The semiconductor device 1 arranged in the manner described above is mounted on a printed circuit board 7, as shown in FIG. 8. On the printed circuit board 7, a plurality of lands 8 are located at positions corresponding to the outer leads 4b of the semiconductor device 1 to be mounted thereon. The lands 8 are connected to an interconnection pattern (not shown), and the outer end portion of each of the outer leads 4b of the semiconductor device 1 is connected and fixed to the corresponding land 8 by solder 9. To mount the semiconductor device 1 on the printed circuit board 7, a solder paste is applied to the printed circuit board 7 by screen printing or the like, the semiconductor device 1 is mounted on the printed circuit board 7 together with other electric parts (not shown), and then the entirety is heated to melt the solder and thereby mount the semiconductor device. The interconnections formed in the printed circuit board 7 include a grounding line 10a and a power supply line 10b.

In the aforementioned conventional semiconductor device, the leads are fanned out on the same plane as that of the semiconductor chip. Consequently, as the number of leads increases, the length through which the leads are extended also increases. The leads may be extended, for example, 10 mm or more. Hence, the length of the power supply lead and the grounding lead, which should have a low inductance, increases, precluding a reduction in the inductance. Furthermore, if it is desired to increase the width of the power supply lead and the grounding lead in order to reduce the inductance thereof, fan out of the other signal leads is made impossible. This results in a reduction in the number of leads.

SUMMARY OF THE INVENTION

Accordingly, an object of the present invention is to provide a semiconductor device which enables the inductance of a power voltage supply lead and that of a grounding voltage lead to be reduced without the total number of leads being reduced and which exhibits excellent electric characteristics.

In order to achieve the above object, the present invention provides a semiconductor device in which a semiconductor chip is accommodated in a molding resin, which comprises a semiconductor chip with a plurality of electrodes on a main surface thereof, electrical connection means including a plurality of conductive connections disposed around the semiconductor chip and on the same plane as that of the semiconductor chip for electrical connection between the semiconductor chip and an external circuit for various I/O signals, a power supply voltage and a grounding voltage, power supply/grounding voltage connection means including at least a single metal post provided on the at least one conductive connection for the power supply voltage and the grounding voltage in the plurality of conductive connections serving as the electrical connection means, one end of the metal post being electrically connected a portion of the conductive connection located close to the semiconductor chip, the metal post extending from the conductive connection nearly perpendicular thereto, and a molding resin for packaging the aforementioned components with part of each of the conductive connections serving as the electrical connection means and part of each of the metal posts serving as the power supply and grounding voltage connection means being exposed therefrom, the molding resin being thin in a direction in which the metal post extends.

In one preferred embodiment, the semiconductor device according to the present invention further comprises at least either of a common plane conductor for the power supply voltage and a common plane conductor for the grounding voltage which extend over the plurality of conductive connections and parallel thereto and to which the plurality of conductive connections for the power supply voltage and those for the grounding voltage are respectively connected in common.

DETAILED DESCRIPTION OF THE PREFERRED EMBODIMENTS

Figure 1:
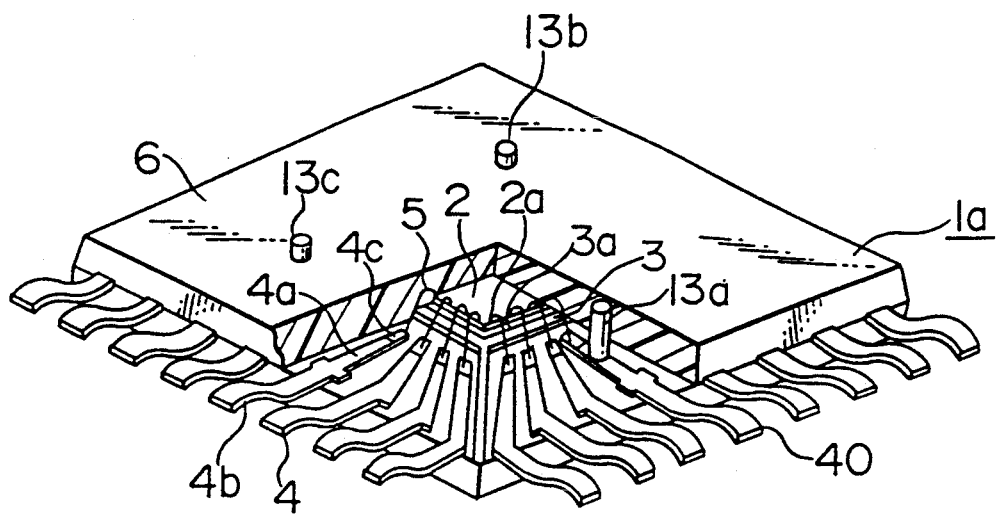
FIG. 1 is a perspective view of a semiconductor device showing a first embodiment of the present invention.
Figure 2:
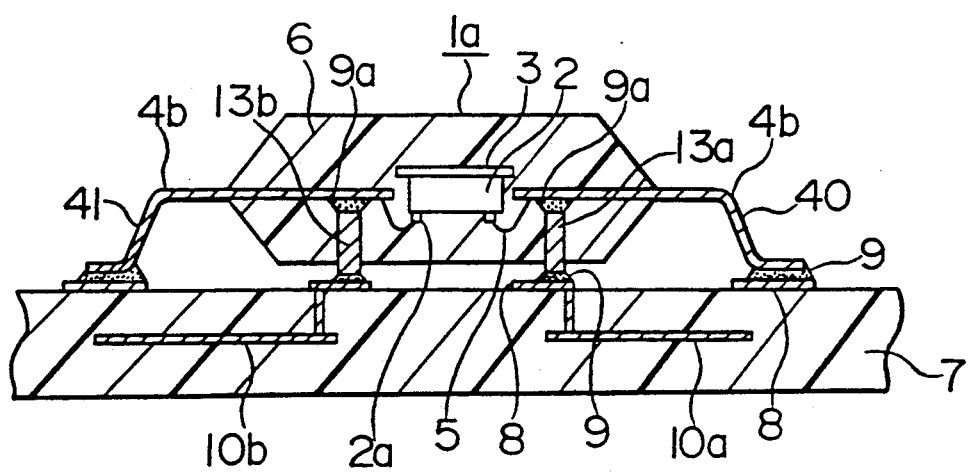
FIG. 2 is a cross-sectional view showing mounting of the semiconductor device of FIG. 1 on a printed circuit board.
Figure 7:
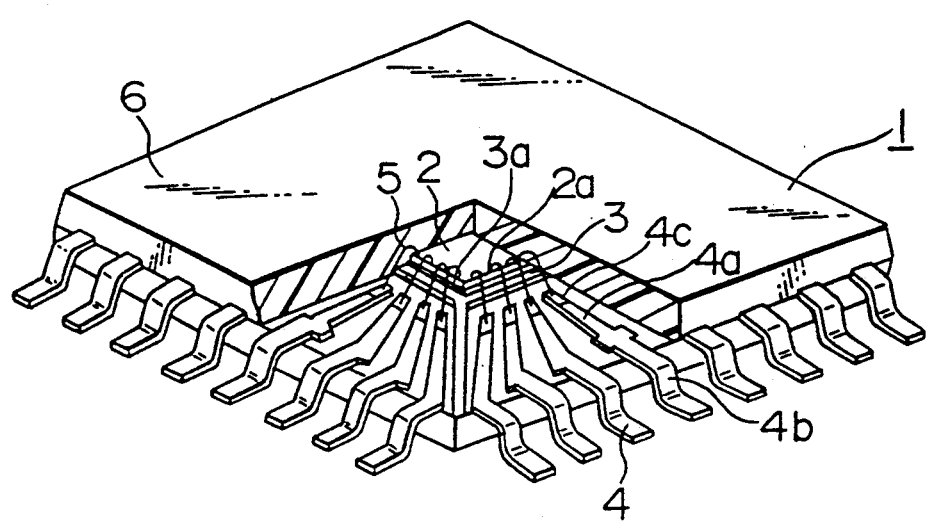
FIG. 7 is a perspective view of a conventional semiconductor device.
Figure 8:
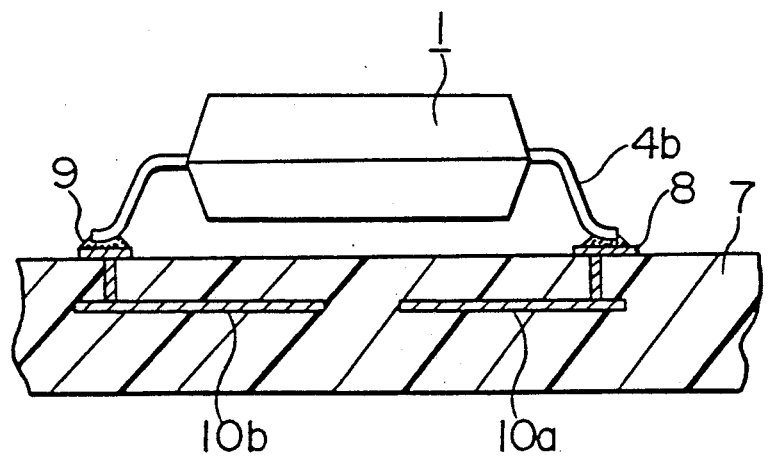
FIG. 8 is a cross-sectional view showing mounting of a semiconductor device of FIG. 7 on the printed circuit board.

FIG. 1 is a perspective view of a semiconductor device showing an embodiment of the present invention. FIG. 2 is a cross-sectional view showing mounting of the semiconductor device of FIG. 1 on a printed circuit board. Identical reference numerals in these figures and in FIGS. 7 and 8 represent similar or identical elements, detailed description thereof being omitted. A semiconductor device 1a shown in FIG. 1 is partially broken away to illustrate the internal structure thereof. To explain the internal structure, the semiconductor device 1a is shown in FIG. 1 with the surface thereof which opposes the circuit board when the semiconductor device 1a is mounted on the printed circuit board toward the top. Thus, the outer lead 4b of each of the leads 4 is bent upward.

The semiconductor chip 2 sealed in the molding resin 6 has the plurality of electrode pads 2a on the main surface thereof. The plurality of leads 4, which form conductive conons, are provided around and on the same plane as that of the semiconductor chip 2 for electrically connecting the semiconductor chip 2 to an external device. The leads 4 include I/O signal leads, the grounding lead 40 for grounding voltage, and the power supply lead 41 (see FIG. 2) for the power supply voltage. The inner end portion 4c of the inner lead 4a of each of the leads 4 which is silver (Ag) plated is connected to a corresponding electrode pad 2a of the semiconductor chip 2 by the thin metal wire 5.

The outer lead 4b of each of the leads 4 is bent upward, as shown in FIG. 1. The I/O signal leads 4, the grounding lead 40, the power supply lead 41 and the thin metal wires 5 are part of a electrical connection means, and the leads 4, 40, 41 and the thin metal wire 5 connected thereto are inductive connections.

The grounding lead 40 has a grounding metal post 13a perpendicular thereto. One end of the grounding metal post 13a is connected and fixed to the portion of the grounding lead 40 located close to the semiconductor chip 2 with solder 9a (which may also be a plating or an Ag epoxy resin), and the other end (the outer end portion) thereof is exposed from the molding resin 6. Generally, a plurality of grounding leads 40 are provided (this also applies to the power supply lead 41). A grounding metal post 13c is provided on the other grounding lead (not shown). Similarly, the power supply lead 41 (see FIG. 2) has a power supply metal post 13b perpendicular thereto. One end of the power supply metal post 13b is connected and fixed to the portion of the power supply lead 41 located close to the semiconductor chip 2 by solder 9a, and the other end thereof is exposed from the molding resin 6. Both the grounding metal post 13c and the power supply metal post 13b form leads which extend perpendicular to the leads 4. Provision of the metal post on each of the grounding leads 40 and the power supply leads 41 is desired. The power supply metal post 13b and the grounding metal posts 13a and 13c are part of the power supply/grounding voltage connection means. The metal posts 13a, 13b and 13c may be mounted on the grounding leads or the power supply leads before or after the wire bonding process in which the inner leads 4a are connected to corresponding electrode pads 2a by the thin metal wires 5. In the resin sealing process, the molding resin 6 is formed such that the outer end portion of each of the metal posts is exposed from the molding resin 6, like the outer lead 4b of each of the leads 4.

FIG. 2 shows the mounting of the semiconductor device 1a with the outer end portions of the metal posts exposed from the surface of the molding resin 6 on the printed circuit board 7. The outer end portions of the outer leads 4b are connected to and fixed to the lands 8 (or the conductive circuit pattern) on the surface of the printed circuit board 7 with solder 9. Similarly, the metal posts are connected and fixed to the lands (or the conductive circuit pattern) with solder 9, like the grounding metal post 13a and the power supply metal post 13b shown in FIG. 2. As a result, the grounding and power supply electrodes pads 2a on the semiconductor chip can be electrically connected to the grounding lead 10a and the power supply lead 10b in the printed circuit board 7 through the metal posts 13a and 13b along the shortest possible distance, respectively. The metal posts 13a and 13b also serve as the spacers.

Figure 3:
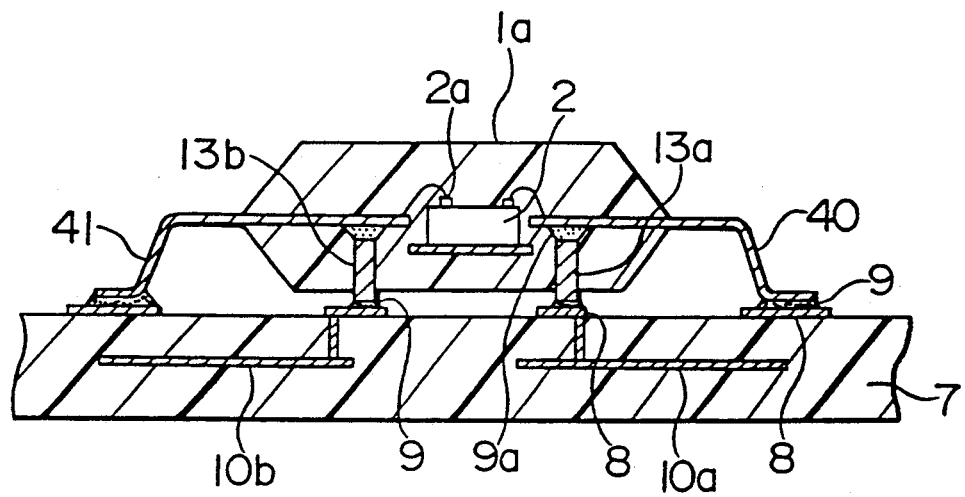
FIG. 3 is a cross-sectional view of a semiconductor device showing a second embodiment of the present invention.

Although FIGS. 1 and 2 show the semiconductor device in which the metal posts are joined to the upper surface of the leads, a semiconductor device in which the metal posts are joined to the under surface of the leads is shown in FIG. 3 as a second embodiment of the present invention. In the case shown in FIG. 3, the electrode pads 2a of the semiconductor chip 2 in the semiconductor device mounted on the printed circuit board are directed upward.

In the aforementioned embodiments, the semiconductor devices which employ a leadframe and wire bonding have been described. The present invention can also be applied to a semiconductor device which employs tape automated bonding (TAB). Such a semiconductor device will be described below.

Figure 4:
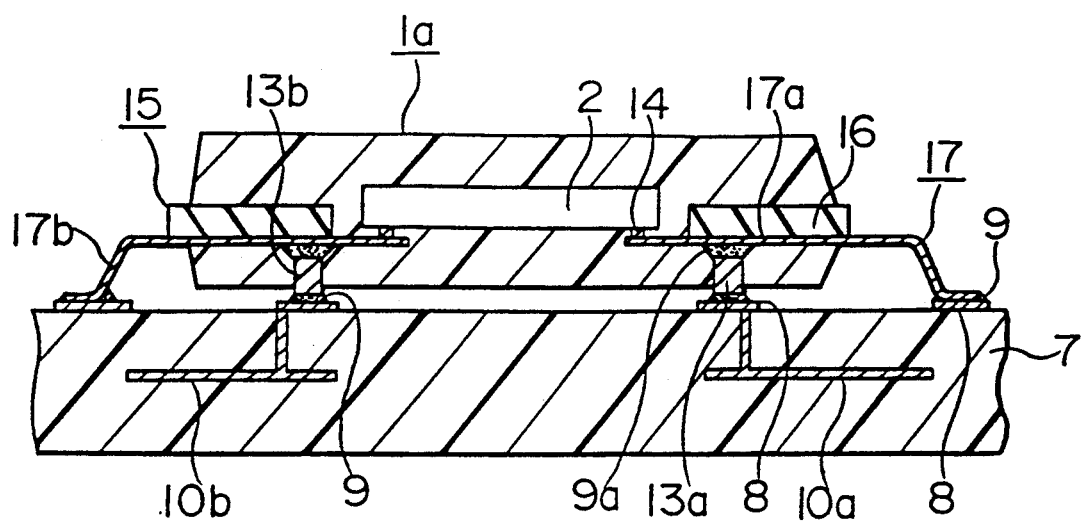
FIG. 4 is a cross-sectional view of a semiconductor device a third embodiment of the present invention.

FIG. 4 is a cross-sectional view of the semiconductor device showing a fourth embodiment of the present invention. The semiconductor device 1a is of the type which employs TAB, and has a protruding electrode 14 on each of the plurality of electrode pads (not shown) provided on the main surface of the semiconductor chip 2. To provide the electrical connection, the semiconductor device 1a is mounted on the printed circuit board 7 with the main surface of the semiconductor chip 2 directed downward. A TAB tape 15 of the electrical connection means includes an insulating polyimide tape 16 extending on the same plane as that of the semiconductor chip 2 and surrounding the semiconductor chip 2, and a large number of conductive patterns 17, which form conductive connections, disposed radially on the insulating polyimide tape 16 as the leads. The inner end portion of each of the patterns 17 is joined to a corresponding electrode pad of the semiconductor chip 2 through the protruding electrode 14 by thermo compression bonding.

Among the patterns 17, a grounding pattern 17a and a power supply pattern 17b respectively have the grounding metal post 13a and the power supply metal post 13b joined to the portion thereof located close to the semiconductor chip 2 by solder 9a, as in the case of the aforementioned embodiments. The outer end portion of the grounding metal post 13a and that of the power supply metal post 13b are exposed from the molding resin 6 such that they can be connected to the lands 8 (or the conductive circuit pattern) on the printed circuit board 7.

Figure 5:
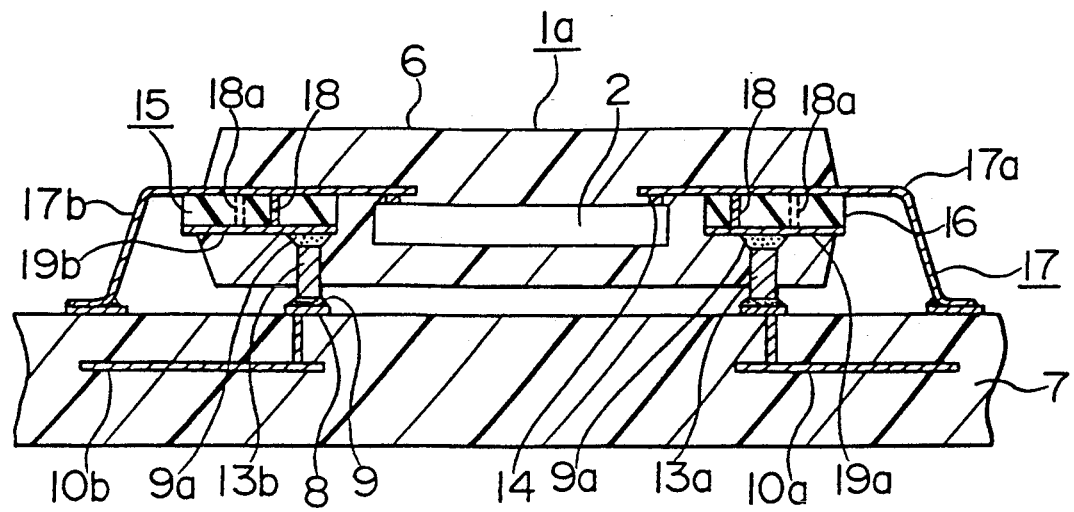
FIG. 5 is a cross-sectional view of a semiconductor device showing a fourth embodiment of the present invention.

FIG. 5 is a cross-sectional view of a semiconductor device showing a fourth embodiment of the present invention. The semiconductor device 1a shown in FIG. 5 is of the type which employs TAB. The semiconductor device 1a is mounted on the printed circuit board 7 with the main surface of the semiconductor chip 2 directed upward. The TAB tape 15 is the polyimide tape 16 with the plurality of patterns 17 on the upper surface thereof. A common plane conductor 19a for the grounding voltage and a common plane conductor 19b for the power supply voltage are provided on the undersurface of the tape 16 extending over the plurality of patterns 17 and parallel thereto.

Among the plurality of interconnects 17, the grounding pattern 17a and the power supply pattern 17b are electrically connected to the plane conductors 19a and 19b through through-holes 18, respectively. Each of the through-holes 18 may be plated or a conductive resin may be embedded in the through-hole 18 to provide an electrical connection between the upper and lower surfaces of the polyimide tape 16, i.e., to form a through-hole. The plane conductors 19a and 19b have the grounding metal post 13a and the power supply metal post 13b respectively joined to the portions thereof located close to the semiconductor chip 2 by the soldering material 9a. The outer end portions of the grounding metal post 13a and the power supply metal post 13b are exposed from the molding resin 6 such that they can be connected to the lands 8 (or the conductive circuit pattern) on the printed circuit board 7.

Regarding the common plane conductor 19a for the grounding voltage, the plurality of I/O signal patterns 17 pass over the plane conductor 19a, which extends over a wide area and which carriers the grounding voltage, with the polyimide tape 16 therebetween. Consequently, the mutual inductance between the I/O signal patterns 17 can be reduced, thus reducing the noise between the signal patterns 17.

Multiple grounding patterns 17a and power supply patterns 17b may be present. In that case, the grounding patterns 17a and the power supply patterns 17b are respectively connected to the common plane conductor 19a for the grounding voltage and the common plane conductor 19b for the power supply voltage through, for example, through-holes 18a indicated by the broken line in FIG. 5 to obtain stable grounding and power supply voltages and hence excellent electrical characteristics are obtained. Also, a plurality of grounding metal posts 13a and a plurality of power supply metal posts 13b may be respectively provided on the common plane conductor 19a for the grounding voltage and the common plane conductor 19b for the power supply voltage to further reduce the inductance on the power supply lines and the grounding lines.

Figure 6:
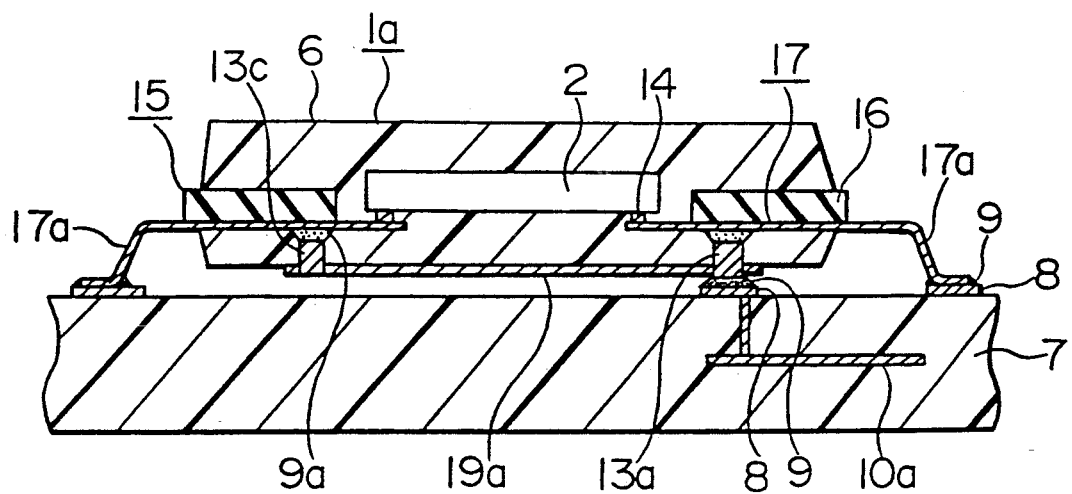
FIG. 6 is a cross-sectional view of a semiconductor device showing a fifth embodiment of the present invention.

FIG. 6 is a cross-sectional view of the semiconductor device showing a fifth embodiment of the present invention. In this embodiment, the common plane conductor 19a for the grounding voltage is provided on the under surface of the molding resin 6 to connect the grounding metal posts 13a and 13c provided on the separate grounding patterns 17a together. This structure can also be applied to the semiconductor devices of the first and second embodiments, shown in FIGS. 1 through 3, which employ a leadframe and the wire bonding.

As will be understood from the foregoing description, in the present invention, metal posts exposed from the molding resin are provided on leads or patterns for the power supply voltage and for the grounding voltage in order to connect the power voltage and grounding voltage to an external circuit through the metal posts. Consequently, the length of the connecting lines between the power supply and grounding electrode pads on the semiconductor chip and the external circuit can be reduced, thus reducing the inductance on the power supply line and grounding line and thereby providing a semiconductor device which has a low level of noise and thus has excellent electrical characteristics.

Furthermore, when common plane conductors for the grounding voltage and the power supply voltage are provided to connect the leads, patterns or metal posts for the power supply voltage or grounding voltage, the grounding and power supply voltages can be stabilized. Particularly, the provision of the common plane conductor for the grounding voltage reduces the mutual inductance of the I/O signal patterns which pass over the common plane conductor, thereby providing a semiconductor device exhibiting excellent electrical characteristics.

What is claimed is:
1. A semiconductor device comprising;
a semiconductor chip having a main surface and a plurality of electrodes on the main surface;
electrical connection means including a plurality of electrically conductive connections disposed around the semiconductor chip electrically connecting respective electrodes of the semiconductor chip for receiving external signals including I/O signals, a power supply voltage, and a grounding voltage;
power supply/grounding voltage connection means including at least one metal post on one of the conductive connections for conducting one of a power supply voltage and a grounding voltage, the metal post being electrically connected at one end to one of the conductive connections close to the semiconductor chip and extending nearly perpendicular to the conductive connection;
at least one common plane conductor for the power supply voltage and a common plane conductor for the grounding voltage extending over and parallel to the plurality of electrically conductive connections to which the plurality of electrically conductive connections for one of the power supply voltage and the grounding voltage are commonly connected; and
a molding resin encapsulating the semiconductor chip, part of the electrical connection means, and part of the power supply/grounding voltage connection means, part of the metal post being exposed outside the molding resin.

2. A semiconductor device according to claim 1 wherein said electrical connection means includes a TAB tape having various I/O signal patterns, grounding patterns, and power supply patterns on a polyimide tape surrounding the semiconductor chip and protruding electrodes connecting the patterns to corresponding electrodes on the semiconductor chip.

3. A semiconductor device according to claim 1 wherein the at least one of the common plane conductor for the power supply voltage and the common plane conductor for the grounding voltage is disposed in the molding resin.

4. A semiconductor device according to claim 3 wherein said electrical connection means includes a TAB tape having various I/O signal patterns, grounding patterns, and power supply patterns on a polyimide tape surrounding the semiconductor chip and protruding electrodes connecting each of the conductive connections to a corresponding electrode on the semiconductor chip wherein the at least one of the common plane conductor for the power supply voltage and the common plane conductor for the grounding voltage is disposed on the polyimide tape remote from the conductive connections.

5. A semiconductor device according to claim 2 wherein the at least one of a common plane conductor for the power supply voltage and a common plane conductor for the grounding voltage is disposed on the molding resin and at least one of the conductive connections for the power supply voltage and the conductive connections for the grounding voltage are connected to the at least one common plane conductors through the at least one metal post.

6. A packaged semiconductor device including;
   a semiconductor chip having a main surface including a plurality of electrodes for receiving respective external signals including I/O signals, a ground potential, and a power supply voltage;
   a plurality of leads extending outwardly from said chip and electrically connected to respective electrodes of the semiconductor chip;
   a resin encapsulating the semiconductor chip and part of each of the leads with part of each of the leads extending from the resin; and
   at least one metal post mounted on, substantially perpendicular to, and electrically connected to one of the leads within the resin, the post extending through part of and protruding from the resin.

7. A packaged semiconductor device according to claim 6 including a plurality of metal posts mounted on, substantially perpendicular to, and electrically connected to respective leads within the resin, each of the posts extending through part of and protruding from the resin.

8. A packaged semiconductor device according to claim 6 including a plurality of metal wires respectively connecting the electrical leads within the resin to the corresponding electrodes.

9. A packaged semiconductor device according to claim 6 including an electrically insulating tape disposed within the resin, the plurality of leads within the resin being disposed on the tape and extending beyond the tape to and in direct mechanical and electrical contact with the respective electrodes.

10. A packaged semiconductor device according to claim 6 including a printed circuit board including a plurality of electrically conducting lands wherein the leads and metal post are electrically and mechanically connected to respective lands on the printed circuit board.

11. A packaged semiconductor device according to claim 1 including a printed circuit board including a plurality of electrically conducting lands wherein the electrical connection means and metal post are electrically and mechanically connected to respective lands on the printed circuit board.

12. A packaged semiconductor device according to claim 7 including a planar electrical conductor disposed on the resin, electrically connecting at least two of the metal posts.

13. A packaged semiconductor device according to claim 1 including a plurality of metal posts substantially perpendicular to and electrically connected to respective electrical connection means within the resin, each of the posts extending through part of and protruding from the resin.

* * * * *